(12) United States Patent
Kim et al.

(10) Patent No.: US 10,220,607 B2
(45) Date of Patent: Mar. 5, 2019

(54) SCREEN MASK ASSEMBLY

(71) Applicant: Samsung Display Co., Ltd., Yongin-si, Gyeonggi-do (KR)

(72) Inventors: Jeongsu Kim, Yongin-si (KR); Youngmin Kim, Yongin-si (KR); Yoonyee Nam, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/224,454

(22) Filed: Jul. 29, 2016

(65) Prior Publication Data

US 2017/0098800 A1   Apr. 6, 2017

(30) Foreign Application Priority Data

Oct. 6, 2015   (KR) .......................... 10-2015-0140615

(51) Int. Cl.
*B41F 15/34*   (2006.01)
*B41N 1/24*   (2006.01)
*H01L 51/00*   (2006.01)

(52) U.S. Cl.
CPC ............... *B41F 15/34* (2013.01); *B41N 1/24* (2013.01); *H01L 51/0004* (2013.01)

(58) Field of Classification Search
CPC . B41N 1/24; B41N 1/248; B41F 15/34; B41F 15/36; H01L 51/0004; H01L 51/56

USPC ......................................................... 101/127
See application file for complete search history.

(56) References Cited

U.S. PATENT DOCUMENTS

| | | | | |
|---|---|---|---|---|
| 4,078,488 A | * | 3/1978 | Wright | B41C 1/14 |
| | | | | 101/128.21 |
| 5,390,595 A | * | 2/1995 | Cutcher | G03F 7/12 |
| | | | | 101/128.21 |
| 5,693,559 A | | 12/1997 | Taniguchi et al. | |
| 2002/0094639 A1 | | 7/2002 | Reddy | |
| 2009/0283766 A1 | | 11/2009 | Sirkin | |
| 2010/0033084 A1 | | 2/2010 | Ko et al. | |
| 2011/0259218 A1 | * | 10/2011 | Becker | B41F 15/36 |
| | | | | 101/127 |

FOREIGN PATENT DOCUMENTS

| | | | |
|---|---|---|---|
| JP | 9-97760 A | | 4/1997 |
| JP | 11186705 A | * | 7/1999 |
| JP | 2004-106437 A | | 4/2004 |
| JP | 2005297222 A | * | 10/2005 |
| KR | 1997-0069335 A | | 11/1997 |
| KR | 10-2010-0003243 A | | 1/2010 |
| KR | 10-2013-0117976 A | | 10/2013 |

* cited by examiner

*Primary Examiner* — Leslie J Evanisko
(74) *Attorney, Agent, or Firm* — Lewis Roca Rothgerber Christie LLP

(57) ABSTRACT

A screen mask assembly includes: a mask frame; a screen mask on the mask frame, the screen mask having a plurality of paste openings; and a plurality of paste blocking portions on the screen mask.

12 Claims, 6 Drawing Sheets

SCREEN MASK ASSEMBLY

CROSS-REFERENCE TO RELATED APPLICATION

This application claims priority to and the benefit of Korean Patent Application No. 10-2015-0140615, filed on Oct. 6, 2015 in the Korean Intellectual Property Office, the disclosure of which is incorporated herein in its entirety by reference.

BACKGROUND

1. Field

One or more exemplary embodiments relate to a screen mask assembly.

2. Description of the Related Art

Generally, display devices may be used in various electronic devices, such as mobile devices including smartphones, laptop computers, digital cameras, camcorders, portable information terminals, tablet personal computers (PCs), and so forth, and also in desktop computers, televisions, billboards, display devices for exhibition, and the like.

A display device may include a filling layer for preventing opposing substrates from contacting each other. In the display device, a thinner filling layer provides a wider viewing angle.

SUMMARY

One or more exemplary embodiments include a screen mask assembly for forming a filling layer having a reduced thickness.

Additional aspects will be set forth, in part, in the description which follows and, in part, will be apparent from the description or may be learned by practice of the presented embodiments.

According to one or more exemplary embodiments, a screen mask assembly includes: a mask frame; a screen mask on the mask frame, the screen mask having a plurality of paste openings; and a plurality of paste blocking portions on the screen mask.

The screen mask may include: a plurality of first wires spaced from each other in a first direction; and a plurality of second wires spaced from each other in a second direction crossing the first direction. Each of the plurality of paste openings may be surrounded by one or more of the plurality of first wires and one or more of the plurality of second wires, and the plurality of paste blocking portions may block at least some of the plurality of paste openings.

A maximum of 95% of the plurality of paste openings may be blocked by the plurality of paste blocking portions.

One of the plurality of paste openings may have the same size as one of the plurality of paste blocking portions, and one of the plurality of paste openings may be divided into a plurality of unit openings.

In one of the plurality of paste openings, a first line may extend in the first direction and a second line may extend in the second direction, and the one of the plurality of paste openings may divided into the plurality of unit openings at an intersection between the first line and the second line.

The plurality of paste openings and the plurality of paste blocking portions may be alternately arranged.

The plurality of paste openings and the plurality of paste blocking portions may be present at a ratio of about 50:50.

In one of the plurality of paste openings, a first line may extend in the first direction and a second line may extend in the second direction, and the one of the plurality of paste openings may be divided into a plurality of unit openings at an intersection between the first line and the second line.

An area of the screen mask covered by the plurality of paste blocking portions may be greater than an area of the screen mask at where the plurality of paste openings are arranged.

The plurality of paste blocking portions may include: a plurality of first paste blocking portions spaced from each other in the first direction; and a plurality of second paste blocking portions spaced from each other in the second direction. The plurality of first paste blocking portions and the plurality of second paste blocking portions may be connected to each other.

The plurality of paste openings may be spaced from each other with ones of the plurality of paste blocking portions therebetween.

In one of the plurality of paste openings, a first line may extend in the first direction and a second line may extend in the second direction, and the one of the plurality of paste openings may be divided into a plurality of unit openings at an intersection between the first line and the second line.

The plurality of paste blocking portions may be arranged in a cross-shape pattern.

The plurality of paste blocking portions may be coated on outer surfaces of the plurality of first wires and the plurality of second wires.

The screen mask may include a metallic material.

The plurality of paste blocking portions may include a polymer.

BRIEF DESCRIPTION OF THE DRAWINGS

These and/or other aspects of the present disclosure will become apparent and more readily appreciated from the following description of exemplary embodiments, taken in conjunction with the accompanying drawings in which.

DETAILED DESCRIPTION

Figure 1:
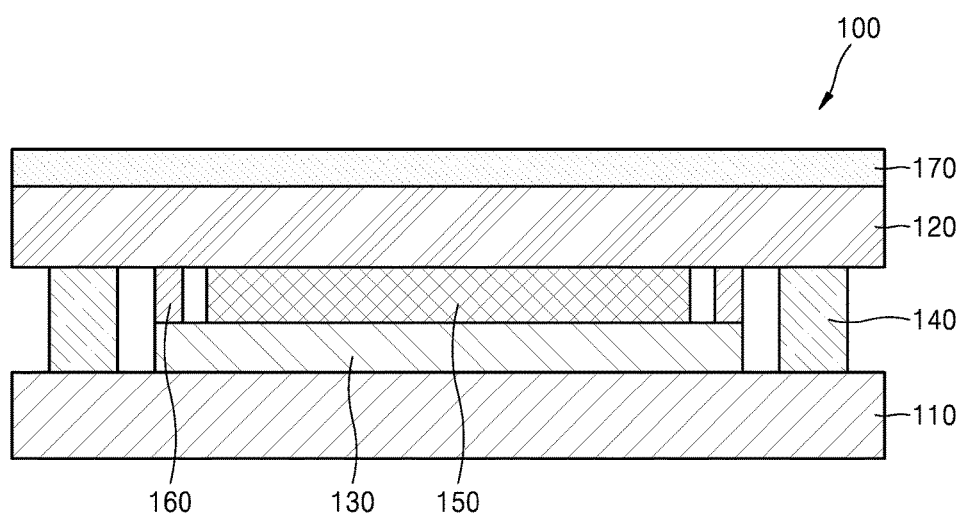
FIG. 1 is a cross-sectional view schematically illustrating a display device according to an embodiment of the present disclosure.

While some embodiments are illustrated in the drawings and will be described in detail, the description is not intended to limit the present disclosure to the presented embodiments. It should be understood that any changes, equivalents, and substitutions are included herein without departing from the spirit and scope of the present disclosure.

In the description of the present disclosure, a detailed description of well-known techniques may not be provided if it obscures the subject matter of the present disclosure. Expressions, such as "at least one of," when preceding a list of elements, modify the entire list of elements and do not modify the individual elements of the list.

It will be understood that although the terms "first," "second," etc. may be used herein to describe various components, these components should not be limited by these terms. These terms are only used to distinguish one component from another.

Terms used herein are used to describe certain embodiments and are not intended to limit the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

It will be understood that when an element or layer is referred to as being "on," "connected to," or "coupled to" another element or layer, it may be directly on, connected, or coupled to the other element or layer or one or more intervening elements or layers may also be present. When an element is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements. As used herein, the term "and/or" includes any and all combinations of one or more of the associated listed items. Further, the use of "may" when describing embodiments of the present invention relates to "one or more embodiments of the present invention." Also, the term "exemplary" is intended to refer to an example or illustration. As used herein, the terms "use," "using," and "used" may be considered synonymous with the terms "utilize," "utilizing," and "utilized," respectively.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Hereinafter, a screen mask assembly according to embodiments of the present disclosure will be described in detail with reference to the accompanying drawings. Identical or substantially similar components in the description and the drawings will be given identical reference numerals, and a repetitive description thereof may not be provided.

FIG. 1 is a cross-sectional view schematically illustrating a display device 100 according to an embodiment of the present disclosure.

Although an organic light emitting diode (OLED) device will be described as the display device 100 in the current embodiment, other display devices, such as a liquid crystal display (LCD), a field emission display device (FED), and an electronic paper display (EPD) may also be used.

Referring to FIG. 1, the display device 100 may include a display substrate 110 and a sealing substrate 120 disposed on (e.g., arranged over) the display substrate 110.

The display substrate 110 may be a glass substrate being relatively rigid or a polymer substrate. The sealing substrate 120 may be a glass substrate or a resin substrate. A display unit 130 for displaying an image is disposed on the display substrate 110.

A sealing portion 140 (e.g., a sealant) is disposed on facing surfaces (e.g., inner surfaces) of the display substrate 110 and the sealing substrate 120. The sealing portion 140 encloses (e.g., surrounds a periphery of) the display unit 130.

An inner filling layer 150 (e.g., an inner filler) is disposed between the display substrate 110 and the sealing substrate 120. The inner filling layer 150 fills a space between the sealing substrate 120 and the display unit 130. The inner filling layer 150 prevents collision between the display substrate 110 and the sealing substrate 120 (e.g., prevents the display substrate 110 and the display unit 130 on the display substrate 110 from contacting the sealing substrate 120). The inner filling layer 150 may be formed by screen printing.

A filling dam 160 is disposed between the sealing portion 140 and the inner filling layer 150.

A functional substrate 170 for performing and/or enabling various functions is disposed on the sealing substrate 120. The functional substrate 170 may be a polarization plate, a touch screen, and/or a cover window.

Figure 2:
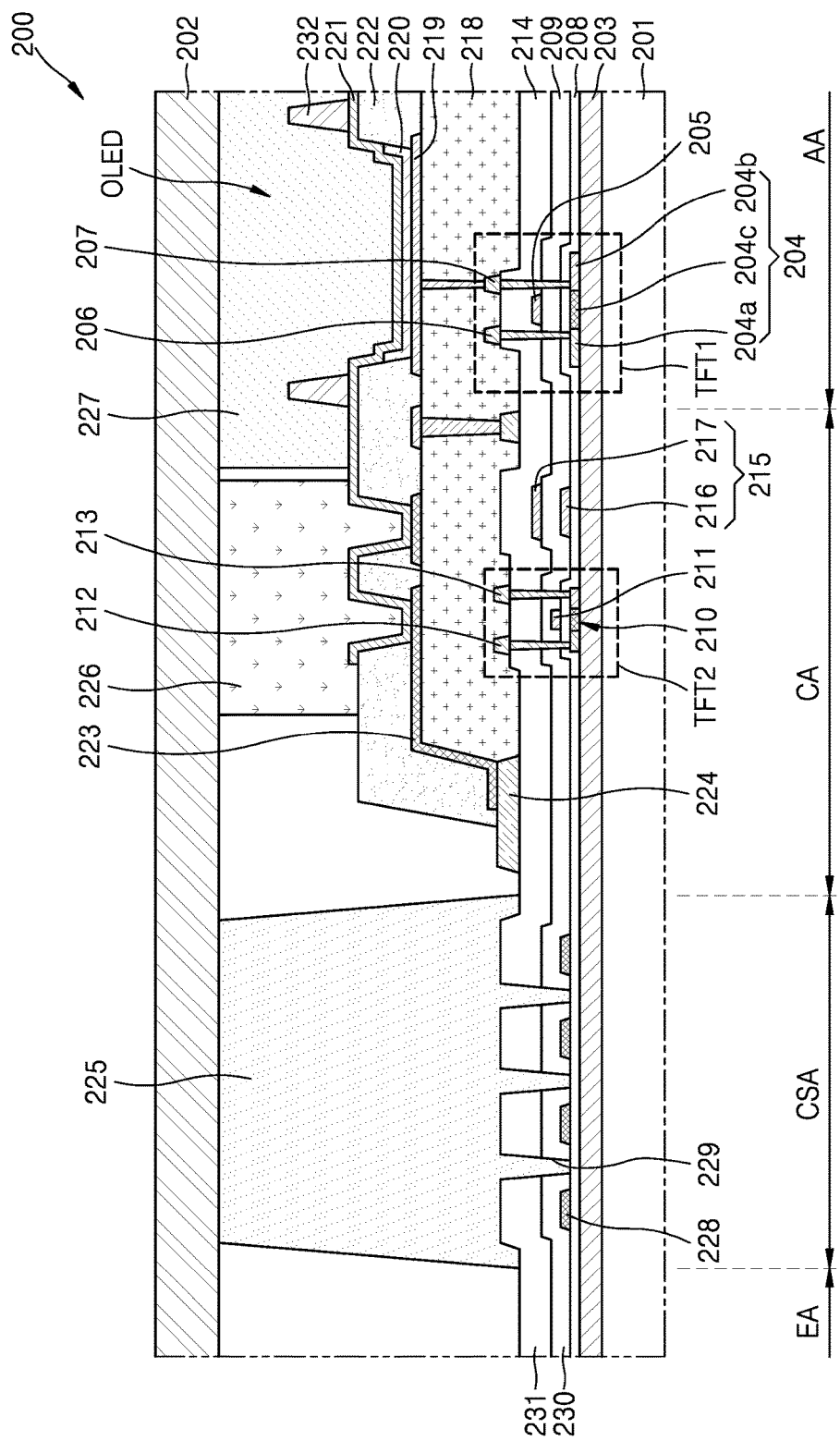
FIG. 2 is an enlarged cross-sectional view of a portion of a display device according to an embodiment of the present disclosure.

FIG. 2 is a cross-sectional view of an enlarged portion of a display device 200 according to an embodiment of the present disclosure.

Referring to FIG. 2, the display device 200 may include a display substrate 201 and a sealing substrate 202 disposed on the display substrate 201.

The display substrate 201 may include an active area AA, a circuit area CA extending outwardly from the active area AA, and a cell seal area CSA extending outwardly from the circuit area CA. An edge area EA, including a cutting area, may be disposed outside of the cell seal area CSA (e.g., outside of the cell seal area CSA with respect to the circuit area CA).

The display substrate 201 may be a glass substrate or a polymer substrate.

A barrier layer 203 may be disposed on the display substrate 201. The barrier layer 203 may be formed of an inorganic material and/or an organic material. The barrier layer 203 may be a single layer or may have a multi-layer structure.

At least one thin film transistor (TFT) may be in each of the active area AA and the circuit area CA. A plurality of TFTs may also be in each of the active area AA and the circuit area CA.

A first thin-film transistor TFT1 in the active area AA may include a first semiconductor active layer 204, a first gate electrode 205, a first source electrode 206, and a first drain electrode 207. The first semiconductor active layer 204 may include a source region 204a and a drain region 204b, which are formed by doping N-type impurity ions or P-type impurity ions. A portion of the first semiconductor active layer 204 between the source region 204a and the drain region 204b may be a channel region 204c that is not doped with impurities. A first gate insulating layer 208 and a second gate insulating layer 209 may be disposed between the first gate electrode 205 and the first semiconductor active layer 204 to insulate the first gate electrode 205 and the first semiconductor active layer 204 from each other.

A second thin-film transistor TFT2 in the circuit area CA may include a second semiconductor active layer 210, a second gate electrode 211, a second source electrode 212, and a second drain electrode 213. The first gate insulating layer 208 may be disposed between the second semiconductor active layer 210 and the second gate electrode 211 to insulate the second semiconductor active layer 210 and the second gate electrode 211 from each other.

The first gate insulating layer 208 and the second gate insulating layer 209 may be formed of the same material. In one embodiment of the present disclosure, the first gate insulating layer 208 and the second gate insulating layer 209 may be inorganic layers.

The first gate electrode 205 and the second gate electrode 211 may be disposed on different layers (e.g., a different number of layers may be between the display substrate 201 and each of the first gate electrode 205 and the second gate electrode 211). The first gate electrode 205 and the second gate electrode 211 may be formed of the same material. In one embodiment of the present disclosure, the first gate electrode 205 and the second gate electrode 211 may be formed of a metallic material having excellent conductivity.

An inter-layer insulating layer 214 may be disposed on the first gate electrode 205. The inter-layer insulating layer 214 may be an inorganic layer or an organic layer.

The first source electrode 206 and the first drain electrode 207 may be disposed on the inter-layer insulating layer 214. The first source electrode 206 and the first drain electrode 207 may be connected to the first semiconductor active layer 204 through respective contact openings (e.g., contact holes). The second source electrode 212 and the second drain electrode 213 may be disposed on the inter-layer insulating layer 214. The second source electrode 212 and the second drain electrode 213 may be connected to the second semiconductor active layer 210 through respective contact openings.

The first source electrode 206, the first drain electrode 207, the second source electrode 212, and the second drain electrode 213 may include the same material (e.g., metals, alloys, metallic nitrides, conductive metallic oxides, transparent conductive materials, and so forth).

A capacitor 215 is in the circuit area CA. The capacitor 215 may include a first capacitor electrode 216, a second capacitor electrode 217, and a second gate insulating layer 209 disposed between the first capacitor electrode 216 and the second capacitor electrode 217.

A planarization layer 218 covers the thin-film transistors TFT1 and TFT2 and the capacitor 215. The planarization layer 218 is disposed on the inter-layer insulating layer 214. The planarization layer 218 may be an inorganic layer or an organic layer.

The OLED may be disposed on the planarization layer 218. The OLED may include a first electrode 219, an intermediate layer 220 including an organic emissive layer, and a second electrode 221.

The first electrode 219 is (e.g., acts or functions as) an anode and may be formed of various suitable conductive materials. The first electrode 219 may include a transparent electrode or a reflective electrode.

A pixel-defining layer 222 is disposed on the planarization layer 218. The pixel-defining layer 222 covers a portion of the first electrode 219. For example, the pixel-defining layer 222 defines a light-emitting region of each sub-pixel by enclosing an edge of (e.g., covering a periphery of) the respective first electrodes 219. The first electrode 219 may be patterned (e.g., separately patterned) for each sub-pixel.

The pixel-defining layer 222 may include an organic layer and/or an inorganic layer. The pixel-defining layer 222 may be a single layer or may have a multi-layer structure.

The intermediate layer 220 may be in a region in which the first electrode 219 is exposed by etching a portion of the pixel-defining layer 222 (e.g., the intermediate layer 220 may be in a region in which the first electrode 219 is formed by etching the portion of the pixel-defining layer 222).

The intermediate layer 220 may include an organic emissive layer.

In another example, the intermediate layer 220 may include an organic emissive layer and a hole injection layer (HIL), a hole transport layer (HTL), an electron transport layer (ETL), and/or an electron injection layer (EIL). However, the intermediate layer 220 may further include other various suitable functional layers in addition to the organic emissive layer without being limited to the above-listed example layers.

The second electrode 221 is (e.g., acts or functions as) a cathode. The second electrode 221 may include a transparent electrode or a reflective electrode.

A spacer 232 is arranged at or on a circumference or periphery of a sub-pixel.

A circuit wiring 223 is in the circuit area CA. The circuit wiring 223 is disposed on the planarization layer 218. The circuit wiring 223 is connected with a power wiring 224. The power wiring 224 is disposed on the inter-layer insulating layer 214. The power wiring 224 may be a wiring to which power is applied from an external source.

A sealing portion 225 (e.g., a sealant) is in the cell seal area CSA. The sealing portion 225 is disposed between the display substrate 201 and the sealing substrate 202. The sealing portion 225 is disposed along a circumference or periphery of the circuit area CA.

A metallic pattern layer 228 is disposed under the sealing portion 225. At least one insulating layer is provided on the metallic pattern layer 228. In one embodiment, a first insulating layer 230 and a second insulating layer 231 are provided on the metallic pattern layer 228. Each of the first insulating layer 230 and the second insulating layer 231 may include a plurality of openings 229.

The sealing substrate 202 may be a glass substrate being relatively rigid or a polymer substrate. A moisture absorbent material or a filling material may be further disposed in an inner space sealed by the display substrate 201, the sealing substrate 202, and the sealing portion 225.

In one embodiment, an inner filling layer 227 (e.g., an inner filler) is in the active area AA.

For example, the inner filling layer 227 fills a space between the sealing substrate 202 and the second electrode 221. The inner filling layer 227 may include a liquid filling material. The inner filling layer 227 may include an inorganic material, such as a silicon-group material. Because the inner filling layer 227 fills the space between the sealing substrate 202 and the second electrode 221, the impact strength of the display substrate 201 and the sealing substrate 202 which are adhered to each other may be increased.

Because the inner filling layer 227 is a liquid filling material, the liquid filling material may spread towards or into an undesired area during manufacturing. To prevent this phenomenon, a filling dam 226 may be disposed between the sealing portion 225 and the inner filling layer 227. The filling dam 226 may prevent the liquid filling material from spreading to other, unintended areas.

The inner filling layer 227 may be formed by screen printing. In one embodiment of the present disclosure, the inner filling layer 227 may be disposed on the sealing substrate 202. The inner filling layer 227 may be coated on the entire surface of the sealing substrate 202.

The inner filling layer 227 may use a solventless paste. The paste for the inner filling layer 227 may have a relatively low viscosity, for example, about 5000 cps to about 10000 cps.

The inner filling layer 227 should be formed relatively thin to provide a relatively wide viewing angle of the display device 200. When the solventless paste is used as the inner filling layer 227, the inner filling layer 227 undergoes little change in its thickness after the printing and drying. Thus, the paste should be coated on the sealing substrate 202 at a desired thickness of the dried inner filling layer 227.

In one embodiment, to reduce the thickness of the inner filling layer 227, the amount of paste to be coated on the sealing substrate 202 may be reduced by increasing pressure applied to a screen mask. However, if the pressure applied to the screen mask is excessive, the screen mask may be damaged. Thus, the amount of paste to be coated on the sealing substrate 202 should be reduced such that the screen mask is not damaged.

Figure 3:
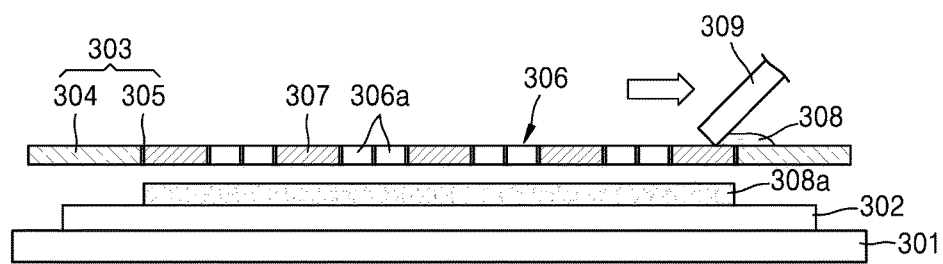
FIG. 3 is a structural diagram illustrating a step of forming a filling layer on a substrate by using a screen mask assembly according to an embodiment of the present disclosure.

FIG. 3 illustrates a step of forming a filling layer 308a on a substrate 302 by using a screen mask assembly 303 according to an embodiment of the present disclosure.

Referring to FIG. 3, the substrate 302 is mounted on a substrate stage 301. The substrate 302 may be relatively rigid and may be, for example, a glass substrate.

The screen mask assembly 303 may be disposed on the substrate 302.

The screen mask assembly 303 may include a mask frame 304 and a screen mask 305 disposed on the mask frame 304. The screen mask 305 may include a metallic material.

A plurality of paste openings 306 (e.g., paste through-holes) may be in the screen mask 305 (e.g., the screen mask 305 may include a plurality of paste openings 306). The paste openings 306 may provide a passage for a paste 308 during screen printing.

A plurality of paste blocking portions 307 may be disposed in at least some of the plurality of paste openings 306. The paste blocking portions 307 may block movement or passage of the paste 308 through the screen mask 305. The paste blocking portion 307 may be formed of a polymer.

In one embodiment, the plurality of paste blocking portions 307 may block a maximum of 95% of the plurality of paste openings 306.

In one embodiment, one paste opening 306 and one paste blocking portion 307 may have the same size as each other (e.g., one of the paste openings 306 may be completely blocked by a corresponding one of the paste blocking portions 307).

In one embodiment, one paste opening 306 may be divided into a plurality of unit openings 306a (e.g., a plurality of unit through-holes).

The paste 308 may be applied on the screen mask assembly 303 having the paste openings 306 and the paste blocking portions 307.

A squeegee blade 309 is moved in a direction on or along the screen mask assembly 303. When the squeegee blade 309 moves, a pressure (e.g., a certain or predetermined pressure) may be applied between the squeegee blade 309 and the screen mask assembly 303. The paste 308 passes through the paste openings 306 due to the squeegee blade 309 to be coated on the substrate 302.

Figure 4:
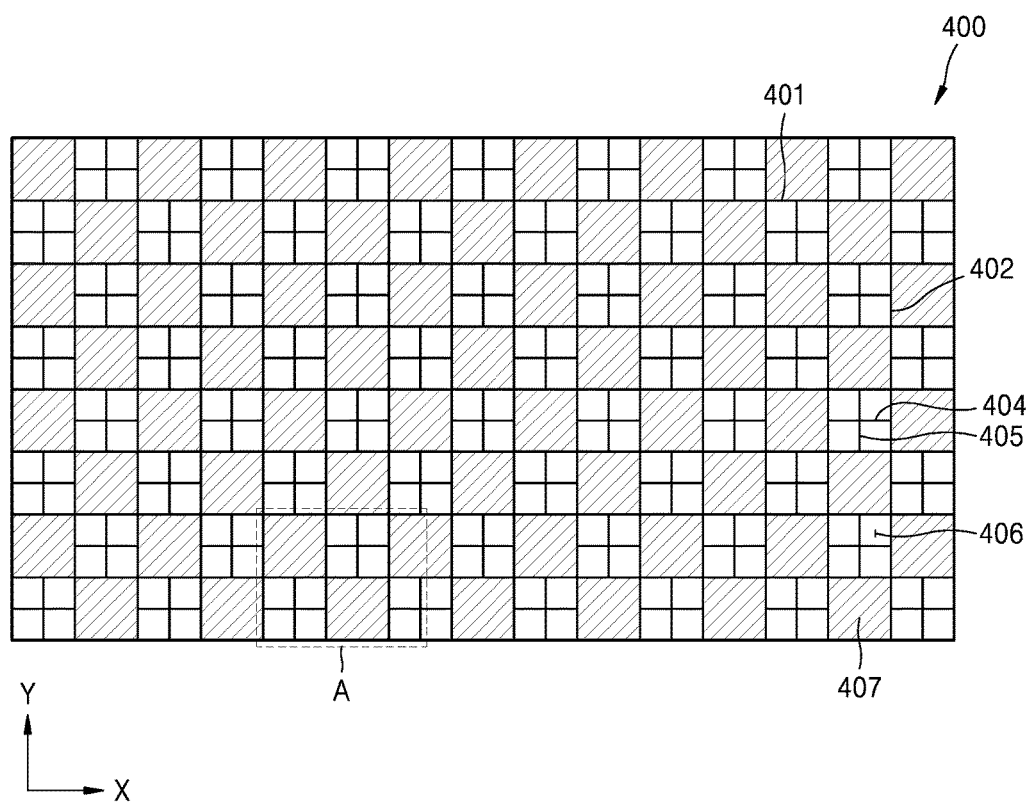
FIG. 4 is a plan view of a screen mask according to an embodiment of the present disclosure.
Figure 5:
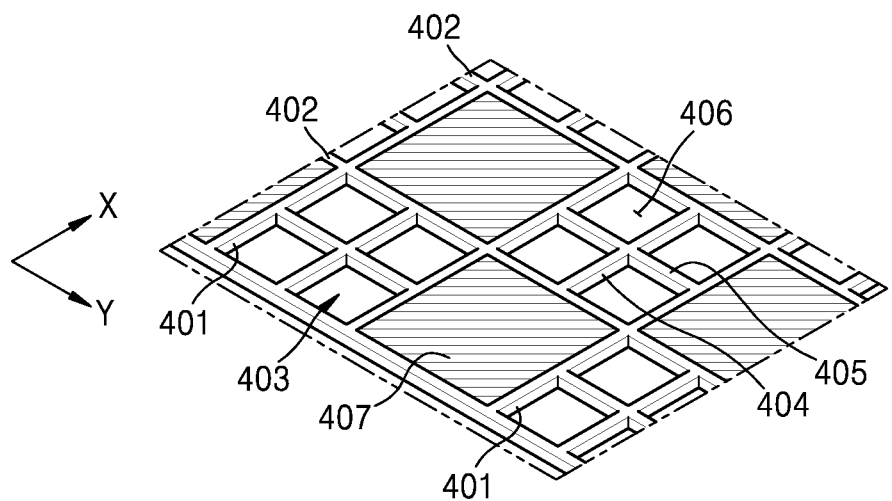
FIG. 5 is a perspective view of an enlarged portion of FIG. 4.

FIG. 4 is a plan view of a screen mask 400 according to an embodiment of the present disclosure, and FIG. 5 is a perspective view of an enlarged portion A of FIG. 4.

Referring to FIGS. 4 and 5, the screen mask 400 may include a plurality of first wires 401 and a plurality of second wires 402.

The plurality of first wires 401 extend in an X-direction and are arranged along (e.g., are spaced from each other) in a Y-direction. The plurality of second wires 402 extend in the Y-direction and are arranged along (e.g., are spaced from each other) in the X-direction. The first wires 401 and the second wires 402 may intersect each other.

Ones of the first wires 401 and ones of the second wires 402 may intersect each other to form a paste opening 403 (e.g., a paste through-hole). The first wires 401 and the second wires 402 surround the paste opening 403.

A plurality of paste blocking portions 407 may be disposed in at least some of the plurality of paste openings 403 to block the paste openings 403. In one embodiment, the paste blocking portion 407 may be coated on or between outer surfaces of the first wires 401 and the second wires 402.

The plurality of paste openings 403 and the plurality of paste blocking portions 407 may be alternately arranged. In one embodiment, the paste openings 403 and the paste blocking portion 407 may be a mesh type (e.g., may be in a mesh arrangement). The plurality of paste openings 403 and the plurality of paste blocking portions 407 may be arranged at a ratio of about 50% to about 50% (e.g., there may be about the same number of paste openings 403 as paste blocking portions 407).

One paste opening 403 may be divided into a plurality of unit openings 406 (e.g., unit through-holes). One paste opening 403 may have the same size as one paste blocking portion 407.

For example, in one paste opening 403, at least one first line 404 extends in the X-direction and at least one second line 405 extends in the Y-direction. Ones of the first lines 404 and ones of the second lines 405 intersect each other such that the one paste opening 403 may be divided into a plurality of unit openings 406. The first lines 404 and the second lines 405 surround the unit opening 406.

For example, a horizontal length and a vertical length (e.g., a length and a width) of each of the paste openings 403 and of each of the paste blocking portions 407 may each be about 100 μm. A horizontal length and a vertical length (e.g., a width and a length) of each of the unit openings 406 may each be about 50 μm. Each of the paste blocking portions 407 blocks (e.g., has a size for blocking) four unit openings 406.

Figure 6:
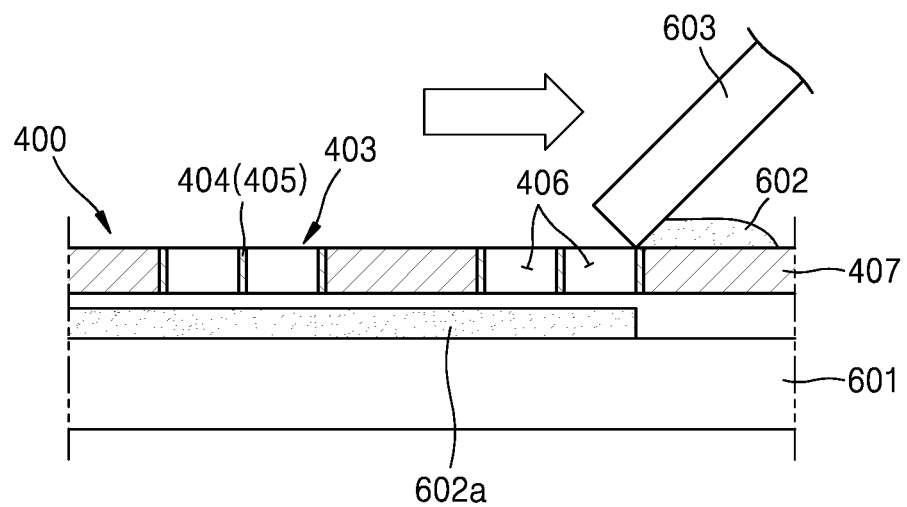
FIG. 6 is a structural diagram illustrating a step of forming a filling layer on a substrate by using the screen mask illustrated in FIG. 4.

FIG. 6 is a structural diagram illustrating a step of forming a filling layer 602a on a substrate 601 by using the screen mask 400 shown in FIG. 4.

Referring to FIG. 6, the screen mask 400 is spaced from the substrate 601 (e.g., the screen mask 400 is arranged over and spaced from the substrate 601). An amount of (e.g., a certain or predetermined amount of) a paste 602 is applied to or placed onto the screen mask 400. The paste 602 may be a solventless paste. The paste 602 may have a relatively low viscosity of, for example, about 5,000 cps to about 10,000 cps.

A squeegee blade 603 is moved (e.g., is forced to move) in a direction (e.g., a direction as indicated by the arrow). A pressure (e.g., a certain and predetermined pressure) may be applied between the squeegee blade 603 and the screen mask 400.

As the squeegee blade 603 moves, the paste 602 may be coated on the substrate 601 through the paste openings 403. For example, the paste 602 may be applied to (e.g., dropped on) the substrate 601 by passing through the plurality of unit openings 406, which are surrounded by the first lines 404 and the second lines 405.

Because the paste blocking portion 407 is disposed between neighboring or adjacent ones of the paste openings 403, the paste 602 may not be applied to (e.g., dropped on) the substrate 601 above where the paste blocking portion 407 is disposed. Accordingly, the amount of the paste 602 applied to the substrate 601 may be reduced.

Table 1 shows exemplary formations of a filling layer according to embodiments of the present applicant and a comparison example.

TABLE 1

| Type of Screen Mask | Wire Diameter | Opening Length | Aperture Ratio (Comparison Example) | Aperture Ratio (Embodiment 1) | Filling Layer Thickness (Comparison Example) | Filling Layer Thickness (Embodiment 1) |
| --- | --- | --- | --- | --- | --- | --- |
| First Sample | 0.028 mm | 50 μm | 41% | 20.5% | 17 μm | 8.5 μm |
| Second Sample | 0.023 mm | 41 μm | 41% | 20.5% | 17 μm | 8.5 μm |

Herein, a comparison example indicates a conventional screen mask which does not include a paste blocking portion, and Embodiment 1 indicates the screen mask 400 including the paste blocking portion 407 illustrated in FIG. 4.

Referring to Table 1, in the first sample and the second sample, an aperture ratio of the screen mask of the comparison example is about 41% of the entire area of the screen mask, whereas an aperture ratio of the screen mask 400 of Embodiment 1 is about 20.5% of the entire area of the screen mask 400.

Because the aperture ratio of the screen mask 400 of Embodiment 1 is about 20.5% and the aperture ratio of the screen mask of the comparison example is about 41%, the aperture ratio of the screen mask 400 of Embodiment 1 is reduced by about 50% from the aperture ratio of the screen mask of the comparison example. As can be seen, the thickness of the paste coated on the substrate may be reduced by about 50%, from about 17 μm to about 8.5 μm.

When the thickness of the filling layer is reduced, the viewing angle of the display device is increased.

Figure 7:
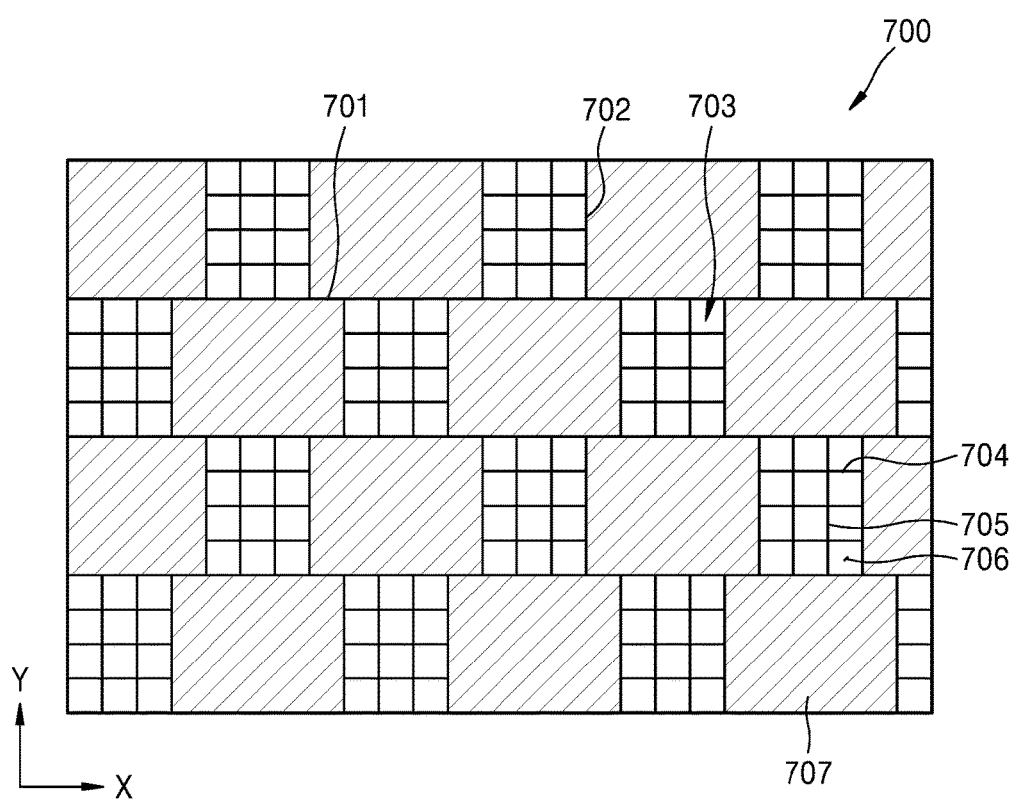
FIG. 7 is a plan view illustrating a screen mask according to another embodiment of the present disclosure.

FIG. 7 is a plan view illustrating a screen mask 700 according to another embodiment of the present disclosure.

The same reference numerals used above and in the previously-described drawings are used to indicate the same or substantially the same features or features functioning in the same or substantially the same manner as in the below-described drawings and the following description.

Referring to FIG. 7, the screen mask 700 may include a plurality of first wires 701 and a plurality of second wires 702. The plurality of first wires 701 and the plurality of second wires 702 may intersect each other or may be of a mesh type (e.g., may be arranged to form a mesh).

The plurality of first wires 701 and the plurality of second wires 702 may intersect each other to form a plurality of paste openings 703 (e.g., paste through-holes). A plurality of paste blocking portions 707 may be disposed in at least some of the plurality of paste openings 703.

The plurality of paste openings 703 and the plurality of paste blocking portions 707 may be alternately arranged. An area of the plurality of paste blocking portions 707 may be greater than an area of the plurality of paste openings 703. For example, coating of a substrate may be performed by using the screen mask 700 having a reduced aperture ratio when compared to an aperture ratio of the screen mask 400 shown in FIG. 4. Thus, the thickness of the filling layer may be further reduced.

In one paste opening 703, at least one first line 704 extends in the X-direction and at least one second line 705 extends in the Y-direction. The first line 704 and the second line 705 intersect each other to divide one paste opening 703 into a plurality of unit openings 706 (e.g., unit through-holes).

The number of unit openings 706 is greater than the number of unit openings 406 in the screen mask 400 shown in FIG. 4. By adjusting an aperture size of the unit opening 706, an amount of a paste to be coated on a substrate may be accurately controlled and the thickness of the filling layer may be adjusted.

Figure 8:
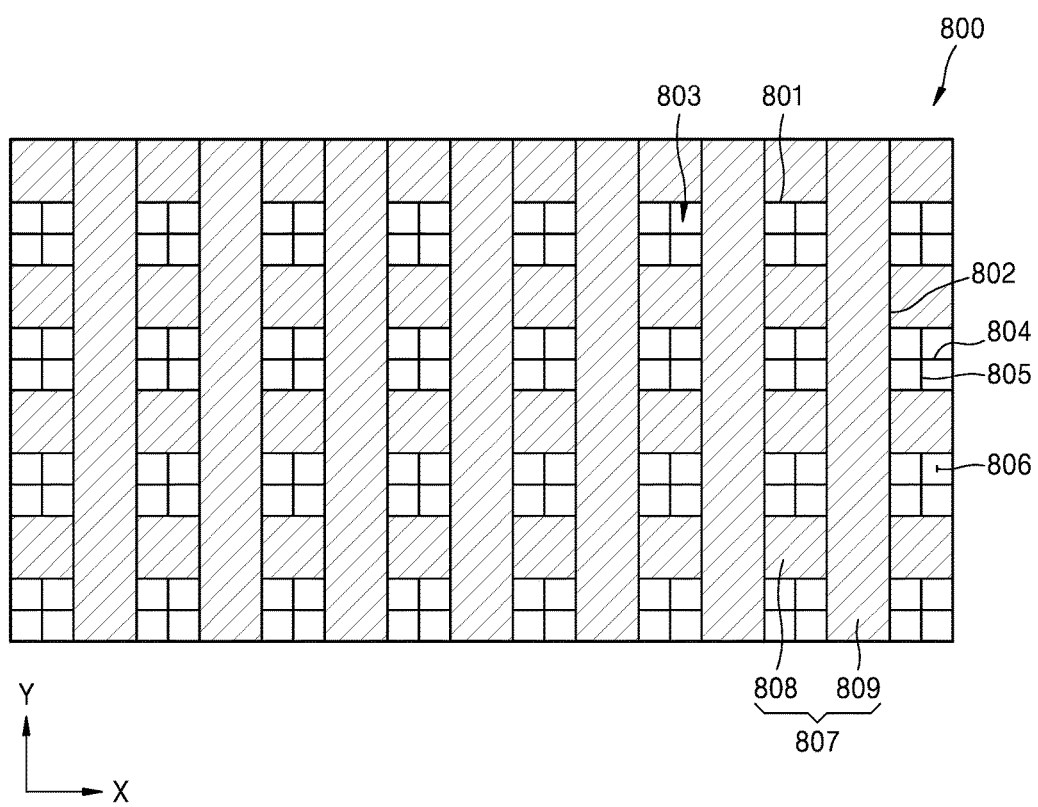
FIG. 8 is a plan view illustrating a screen mask according to another embodiment of the present disclosure.

FIG. 8 is a plan view illustrating a screen mask 800 according to another embodiment of the present disclosure.

Referring to FIG. 8, the screen mask 800 may include a plurality of first wires 801 and a plurality of second wires 802. The plurality of first wires 801 and the plurality of second wires 802 intersect each other. The first wires 801 and the second wires 802 intersect each other to form a plurality of paste openings 803 (e.g., paste through-holes). A plurality of paste blocking portions 807 may be disposed in at least some of the plurality of paste openings 803.

The plurality of paste blocking portions 807 may include a plurality of first paste blocking portions 808 and a plurality of second paste blocking portions 809.

The plurality of first paste blocking portions 808 extend in the X-direction and are arranged along (e.g., spaced from each other in) the Y-direction. The plurality of second paste blocking portions 809 extend in the Y-direction and are arranged along (e.g., spaced from each other in) the X-direction. The first paste blocking portion 808 and the second paste blocking portion 809 may be connected to each other. The first paste blocking portion 808 and the second paste blocking portion 809 may form a cross shape.

The plurality of paste openings 803 may be spaced from each other, having paste blocking portions 807 therebetween. In one paste opening 803, at least one first line 804 extends in the X-direction and at least one second line 805 extends in the Y-direction. The first lines 804 and the second lines 805 intersect each other to divide one paste opening 803 into a plurality of unit openings 806 (e.g., unit throughholes).

A screen mask assembly according to an aspect of the present disclosure may adjust (e.g., reduce) the amount of paste to be coated on a substrate. Other aspects of the present disclosure may also be derived from the above description.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims and their equivalents.

What is claimed is:

1. A screen mask assembly comprising:
   a mask frame;
   a screen mask on the mask frame, the screen mask having a plurality of paste openings, the screen mask comprising:
      a plurality of first wires spaced from each other in a first direction and extending from a first edge of the mask frame to a second edge of the mask frame in a second direction crossing the first direction;
      a plurality of second wires spaced from each other in the second direction and extending from a third edge of mask frame to a fourth edge of the mask frame in the first direction;
      a plurality of first lines spaced from each other in the first direction; and
      a plurality of second lines spaced from each other in the second direction; and
   a plurality of paste blocking portions on the screen mask,
   wherein each of the plurality of paste openings is surrounded by one or more of the plurality of first wires and one or more of the plurality of second wires,
   wherein the plurality of paste blocking portions blocks at least some of the plurality of paste openings,
   wherein, in one paste opening from among the plurality of paste openings, at least one of the first lines extends in the second direction and at least one of the second lines extends in the first direction, the first and second lines extending a shorter distance than the first and second wires, respectively,
   wherein the one paste opening from among the plurality of paste openings is divided into a plurality of unit openings due to intersection of one of the first lines with one of the second lines, and
   wherein each of the plurality of unit openings is surrounded by one of the first wires, one of the second wires, one of the first lines, and one of the second lines.

2. The screen mask assembly of claim 1, wherein a maximum of 95% of the plurality of paste openings are blocked by the plurality of paste blocking portions.

3. The screen mask assembly of claim 1, wherein the one paste opening from among the plurality of paste openings has the same size as one of the plurality of paste blocking portions.

4. The screen mask assembly of claim 1, wherein the plurality of paste openings and the plurality of paste blocking portions are alternately arranged.

5. The screen mask assembly of claim 4, wherein the plurality of paste openings and the plurality of paste blocking portions are present at a ratio of about 50:50.

6. The screen mask assembly of claim 4, wherein an area of the screen mask covered by the plurality of paste blocking portions is greater than an area of the screen mask at where the plurality of paste openings are arranged.

7. The screen mask assembly of claim 1, wherein the plurality of paste blocking portions comprises:
   a plurality of first paste blocking portions spaced from each other in the first direction; and
   a plurality of second paste blocking portions spaced from each other in the second direction, and
   wherein the plurality of first paste blocking portions and the plurality of second paste blocking portions are connected to each other.

8. The screen mask assembly of claim 7, wherein the plurality of paste openings are spaced from each other with ones of the plurality of paste blocking portions therebetween.

9. The screen mask assembly of claim 1, wherein the plurality of paste blocking portions are arranged in a cross-shape pattern.

10. The screen mask assembly of claim 1, wherein the plurality of paste blocking portions is coated on outer surfaces of the plurality of first wires and the plurality of second wires.

11. The screen mask assembly of claim 1, wherein the screen mask comprises a metallic material.

12. The screen mask assembly of claim 1, wherein the plurality of paste blocking portions comprises a polymer.

* * * * *